United States Patent
Kittl et al.

(10) Patent No.: US 9,871,139 B2
(45) Date of Patent: Jan. 16, 2018

(54) SACRIFICIAL EPITAXIAL GATE STRESSORS

(71) Applicant: Samsung Electronics Co., Ltd., Suwon-si, Gyeonggi-do (KR)

(72) Inventors: Jorge A. Kittl, Round Rock, TX (US); Joon Goo Hong, Austin, TX (US); Dharmendar Reddy Palle, Austin, TX (US); Mark S. Rodder, Dallas, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/342,003

(22) Filed: Nov. 2, 2016

(65) Prior Publication Data

US 2017/0338346 A1    Nov. 23, 2017

Related U.S. Application Data

(60) Provisional application No. 62/340,463, filed on May 23, 2016.

(51) Int. Cl.
| | |
|---|---|
| H01L 21/00 | (2006.01) |
| H01L 29/78 | (2006.01) |
| H01L 29/66 | (2006.01) |
| H01L 29/786 | (2006.01) |

(52) U.S. Cl.
CPC .... *H01L 29/7848* (2013.01); *H01L 29/66795* (2013.01); *H01L 29/7851* (2013.01); *H01L 29/7869* (2013.01)

(58) Field of Classification Search
CPC ............ H01L 29/7848; H01L 29/7851; H01L 29/7869; H01L 29/66795
USPC ......................................................... 438/104
See application file for complete search history.

(56) References Cited

U.S. PATENT DOCUMENTS

| | | | |
|---|---|---|---|
| 7,531,393 B2 * | 5/2009 | Doyle ............... | H01L 29/66795 438/151 |
| 8,461,653 B2 * | 6/2013 | Oh .................... | H01L 29/66795 257/349 |
| 8,536,032 B2 | 9/2013 | Cheng et al. | |
| 8,697,523 B2 | 4/2014 | Cai et al. | |
| 9,034,716 B2 | 5/2015 | Sun et al. | |
| 9,202,918 B2 | 12/2015 | Xie et al. | |
| 9,245,885 B1 | 1/2016 | Xie et al. | |
| 9,263,580 B2 * | 2/2016 | Jacob .................. | H01L 29/7849 |
| 9,299,837 B2 | 3/2016 | Cheng et al. | |
| 9,312,360 B2 | 4/2016 | Cheng et al. | |
| 9,318,581 B1 | 4/2016 | Guo et al. | |
| 9,331,148 B1 | 5/2016 | Doris et al. | |
| 2013/0119405 A1 | 5/2013 | Wu et al. | |
| 2014/0042500 A1 * | 2/2014 | Wann ................ | H01L 29/41791 257/288 |
| 2015/0162445 A1 | 6/2015 | Wu et al. | |
| 2015/0255542 A1 | 9/2015 | Cai et al. | |

(Continued)

*Primary Examiner* — Vu A Vu

(74) *Attorney, Agent, or Firm* — Lewis Roca Rothgerber Christie LLP

(57) ABSTRACT

A method for fabricating a fin field effect transistor (finFET) device with a strained channel. During fabrication, after the fin is formed, a sacrificial epitaxial gate stressor is deposited on the fin, causing strain in the fin. SD structures are then formed to anchor the ends of the fin, and the sacrificial epitaxial gate stressor is removed.

20 Claims, 11 Drawing Sheets

(56) References Cited

U.S. PATENT DOCUMENTS

2015/0279973 A1\* 10/2015 Akarvardar ......... H01L 29/1054
  438/283
2015/0349123 A1   12/2015 Cheng et al.
2016/0118472 A1    4/2016 Qi \* cited by examiner

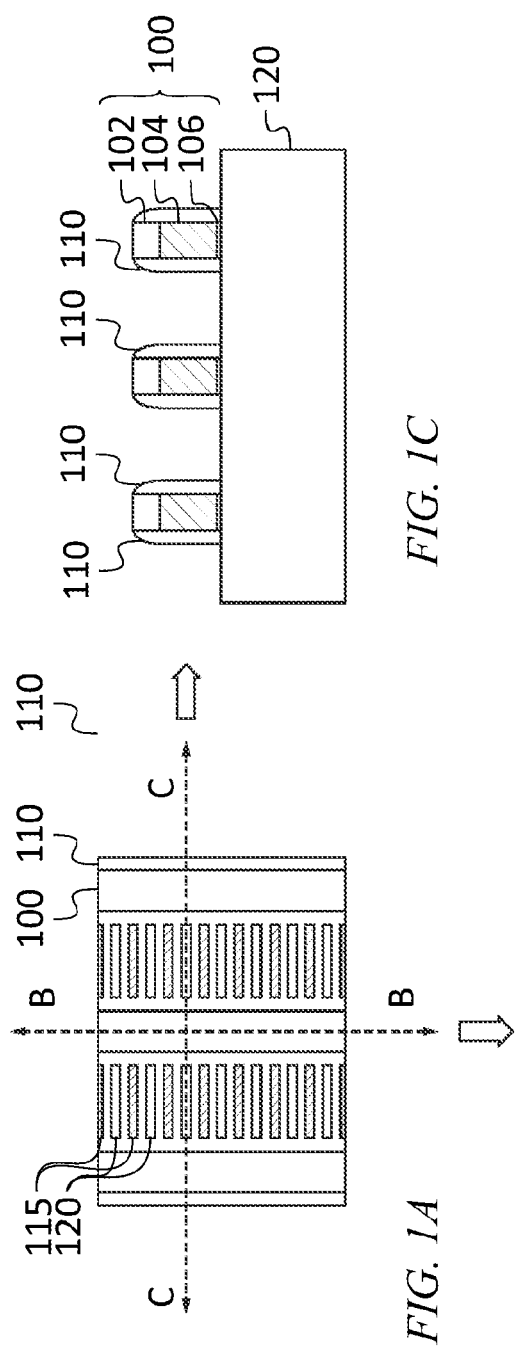

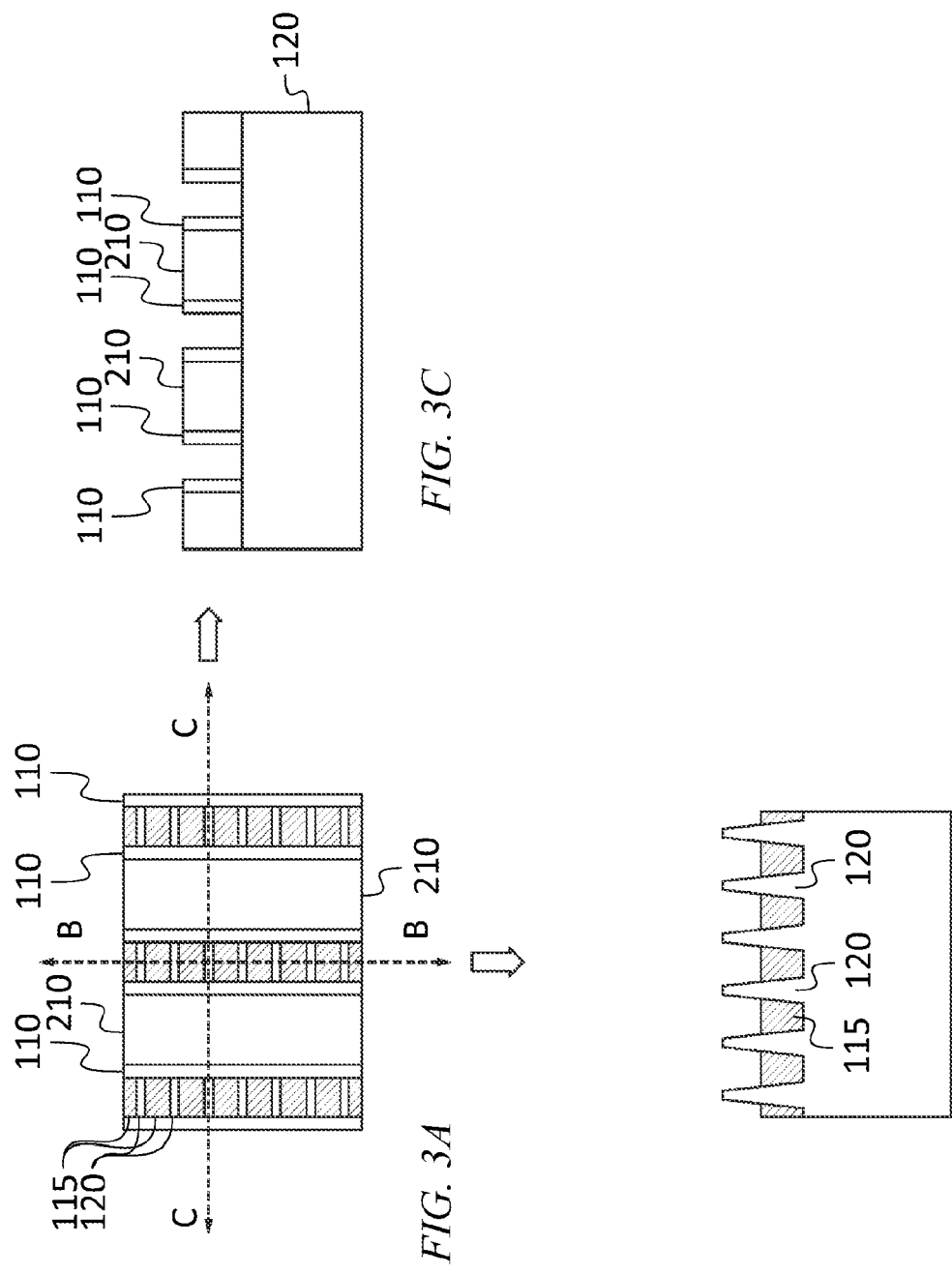

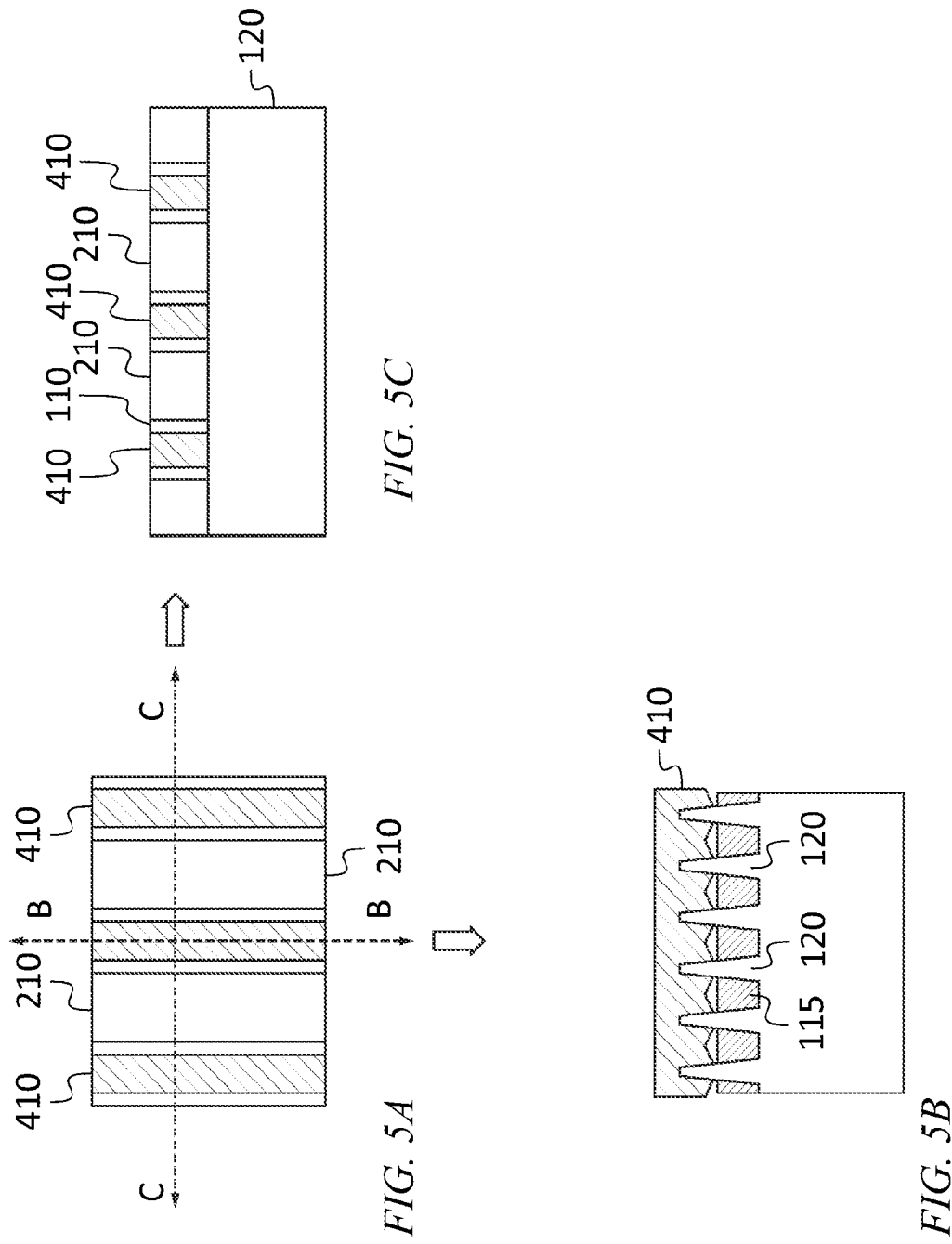

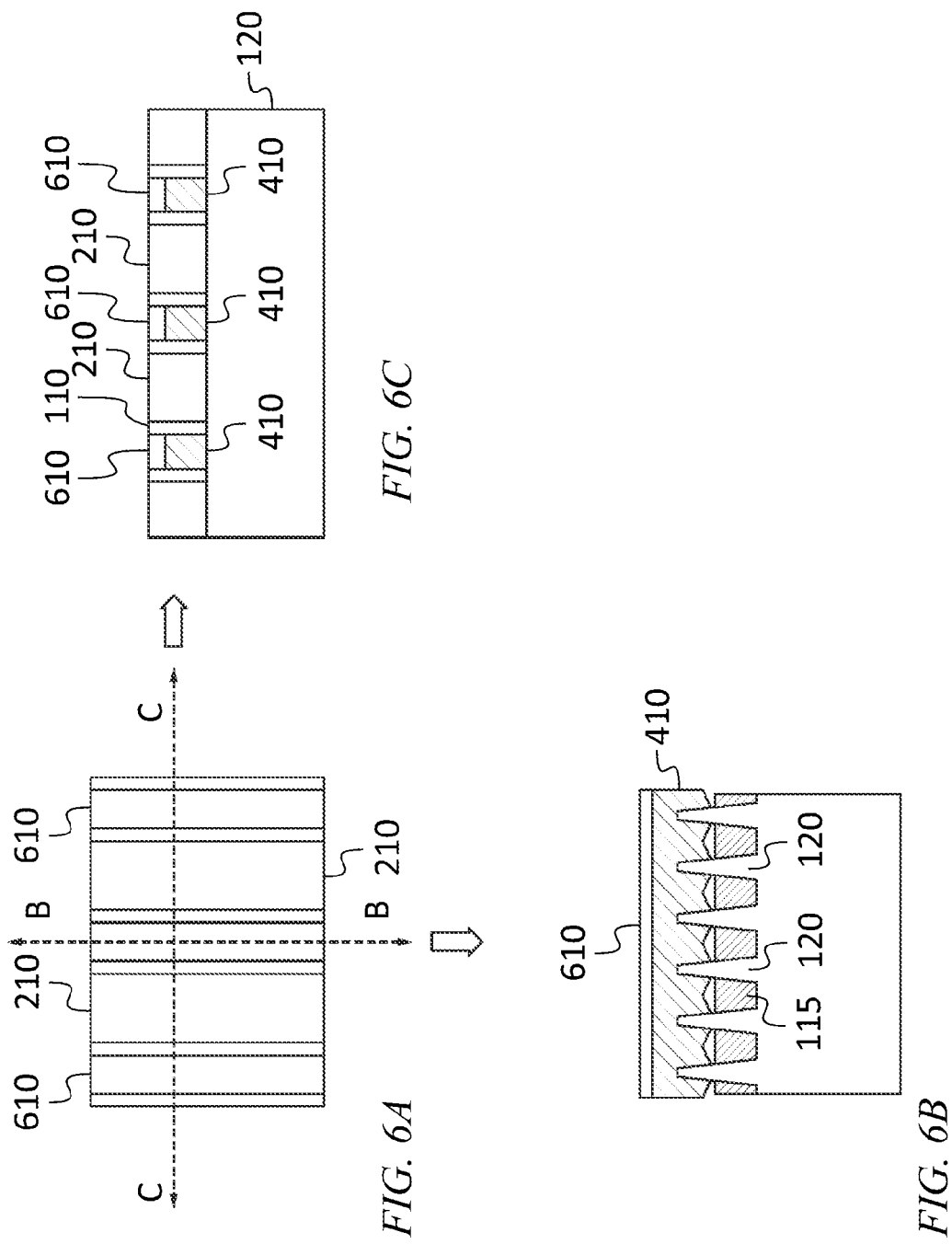

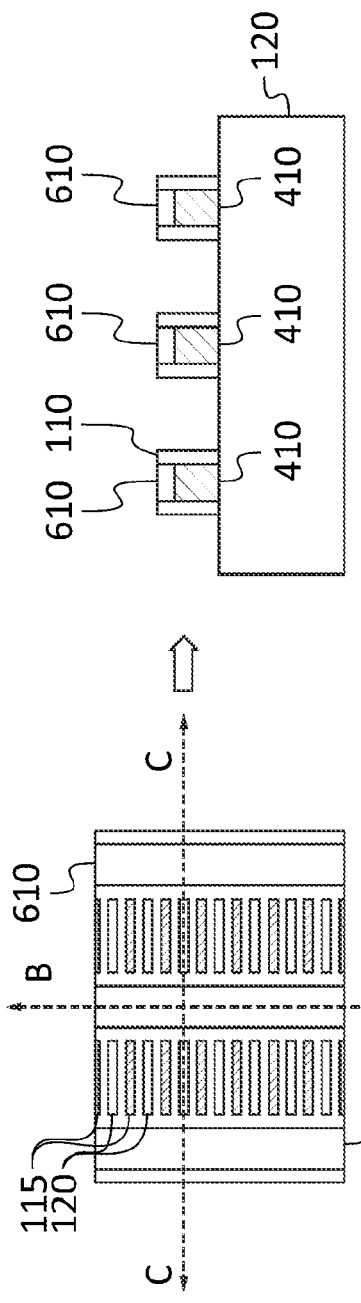
FIG. 7A
FIG. 7B
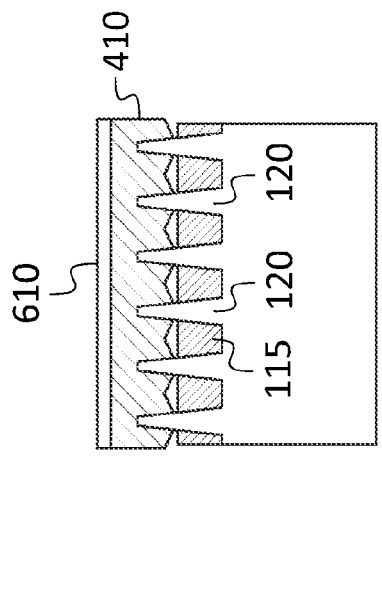
FIG. 7C

1

SACRIFICIAL EPITAXIAL GATE STRESSORS

CROSS-REFERENCE TO RELATED APPLICATION(S)

The present application claims priority to and the benefit of U.S. Provisional Application No. 62/340,463, filed May 23, 2016, entitled "SACRIFICIAL EPITAXIAL GATE STRESSORS", the entire content of which is incorporated herein by reference.

FIELD

One or more aspects of embodiments according to the present invention relate to strained channel field effect transistors, and more particularly to a method for fabricating field effect transistors with a strained channel.

BACKGROUND

Strained channel field effect transistors may exhibit performance characteristics differing from, and in some circumstances superior to, those of unstrained channel field effect transistors. Related art methods of fabricating strained channel field effect transistors may have various drawbacks. For example, the use of source drain (SD) stressors may become less efficient with scaling due to smaller SD volume. Also, SD stressors may be poorly suited for achieving tensile strained channels in n-type metal oxide semiconductor (nMOS) devices. Flows with built in stressed layers as starting material and flows using underlayer stressors may face difficulties in maintaining the stress through the fabrication flow, losing, for example, most of the initial stress. In particular, stress may be lost during deep SD recess and/or fin cut, due to elastic relaxation. This strain loss may not be fully recovered during SD epitaxial regrowth. With significant effort in the epitaxial SD regrowth module, some strain may be partially recovered, but in some cases practically no strain recovery occurs at this module. If the deep SD recess is eliminated and epitaxial growth is added on top of the fin structure on the SD, without previously performing a SD recess, poor doping profiles may result.

Thus, there is a need for a method for fabricating strained channel field effect transistors that addresses these challenges.

SUMMARY

Aspects of embodiments of the present disclosure are directed toward a method for fabricating a fin field effect transistor (finFET) device with a strained channel. During fabrication, after the fin is formed, a sacrificial epitaxial gate stressor is deposited on the fin, causing strain in the fin, which is realized after deep source and drain recess or fin cut. SD structures are then formed to anchor the ends of the fin, and the sacrificial epitaxial gate stressor is removed.

According to an embodiment of the present invention there is provided a method for fabricating a strained channel for a fin field effect transistor (finFET) device having a fin including the channel, the fin being substantially a single crystal of a material having in its relaxed state a first lattice constant, the method including: forming, on the fin, a stressing structure, the stressing structure being substantially a single crystal of a material having in its relaxed state a second lattice constant different from the first lattice constant; forming a first source drain recess at a first end of the fin; forming a second source drain recess at a second end of the fin; forming a first source drain within the first source drain recess; forming a second source drain within the second source drain recess; and removing the stressing structure.

In one embodiment, the forming of the stressing structure includes growing the stressing structure epitaxially.

In one embodiment, the finFET device is an n-type metal oxide semiconductor device, and the second lattice constant is greater than the first lattice constant by at least 10%.

In one embodiment, the finFET device is an n-type metal oxide semiconductor device, the fin is substantially composed of silicon or silicon germanium, and the stressing structure is substantially composed of silicon germanium with an average germanium content higher than a germanium content of the fin by between 10% and 50%.

In one embodiment, the average germanium content of the stressing structure is higher than the germanium content of the fin by between 20% and 30%.

In one embodiment, a germanium content of the stressing structure varies within the stressing structure from a minimum germanium content to a maximum germanium content, each of the minimum germanium content and the maximum germanium content being greater than 10% and less than or equal to 100%, the difference between the maximum germanium content and minimum germanium content being at least 10%.

In one embodiment, the finFET device is a p-type metal oxide semiconductor device, and the first source drain and/or the second source drain is composed of: silicon, or silicon germanium including at least 30% germanium.

In one embodiment, the finFET device is a p-type metal oxide semiconductor device, and the second lattice constant is less than the first lattice constant by at least 10%.

In one embodiment, the finFET device is a p-type metal oxide semiconductor device, the fin is substantially composed of silicon germanium, and the stressing structure is substantially composed of silicon germanium with an average germanium content lower than a germanium content of the fin by between 10% and 50%.

In one embodiment, the average germanium content of the stressing structure is lower than the germanium content of the fin by between 20% and 30%.

In one embodiment, a germanium content of the stressing structure varies within the stressing structure from a minimum germanium content to a maximum germanium content, each of the minimum germanium content and the maximum germanium content being greater than 10% and less than or equal to 100%, the difference between the maximum germanium content and minimum germanium content being at least 10%.

In one embodiment, the forming of the first source drain includes growing the first source drain as an epitaxial layer; and the forming of the second source drain includes growing the second source drain as an epitaxial layer, a strain state in the channel after the forming of the first source drain and the forming of the second source drain having a strain greater, by at least 10%, than a strain of the strain state in the channel before the forming of the first source drain and the forming of the second source drain.

In one embodiment, the forming of the first source drain includes growing the first source drain as an epitaxial layer; and the forming of the second source drain includes growing the second source drain as an epitaxial layer, a strain state in the channel after the forming of the first source drain and the forming of the second source drain having a strain differing from a strain of the strain state in the channel before the forming of the first source drain and the forming of the second source drain by no more than 30%.

In one embodiment, the strain of the strain state in the channel after the forming of the first source drain and the forming of the second source drain differs from the strain of the strain state in the channel before the forming of the first source drain and the forming of the second source drain by no more than 10%.

In one embodiment, the forming of the first source drain includes growing the first source drain as a non-epitaxial layer; and the forming of the second source drain includes growing the second source drain as a non-epitaxial layer, a strain state in the channel after the forming of the first source drain and the forming of the second source drain having a strain differing from a strain of the strain state in the channel before the forming of the first source drain and the forming of the second source drain by no more than 30%.

In one embodiment, the strain of the strain state in the channel after the forming of the first source drain and the forming of the second source drain differs from the strain of the strain state in the channel before the forming of the first source drain and the forming of the second source drain by no more than 10%.

In one embodiment, the forming of the first source drain recess includes forming the first source drain recess to a depth of at least about 10 nm; and the forming of the second source drain recess includes forming the second source drain recess to a depth of at least about 10 nm.

In one embodiment, the finFET device is formed on a substrate, and the stressing structure is formed on a vertical surface of the fin and on a horizontal surface of the fin.

According to an embodiment of the present invention there is provided a method for fabricating a strained channel for a fin field effect transistor (finFET) device having a fin including the channel, the fin being substantially a single crystal of a material having in its relaxed state a first lattice constant, the method including: forming, on the fin, a stressing structure, the stressing structure being substantially a single crystal of a material having in its relaxed state a second lattice constant different from the first lattice constant; forming a first source drain recess at a first end of the fin; forming a second source drain recess at a second end of the fin; forming a first source drain within the first source drain recess; forming a second source drain within the second source drain recess; and etching the stressing structure with an etch having an etch selectivity of at least 40:1 for etching the stressing structure selectively to the fin.

According to an embodiment of the present invention there is provided a method for straining a fin of a fin field effect transistor (finFET) device, the fin being substantially a single crystal of a material having in its relaxed state a first lattice constant, the method including: forming, on the fin, a stressing structure, the stressing structure being substantially a single crystal of a material having in its relaxed state a second lattice constant different from the first lattice constant; forming a first source drain recess at a first end of the fin; forming a second source drain recess at a second end of the fin; forming a first source drain at a first end of the fin; forming a second source drain at a second end of the fin; forming an interlevel dielectric (ILD) layer over the first source drain and the second source drain; and removing the stressing structure.

BRIEF DESCRIPTION OF THE DRAWINGS

These and other features and advantages of the present invention will be appreciated and understood with reference to the specification, claims, and appended drawings wherein:

FIG. 1A is a schematic plan view of an intermediate structure in a method for fabricating a strained channel field effect transistor, according to an embodiment of the present invention;

FIG. 1B is a schematic cross-sectional view, along the section line B-B, of the intermediate structure of FIG. 1A;

FIG. 1C is a schematic cross-sectional view, along the section line C-C, of the intermediate structure of FIG. 1A;

FIG. 3A is a schematic plan view of an intermediate structure in a method for fabricating a strained channel field effect transistor, according to an embodiment of the present invention;

FIG. 3B is a schematic cross-sectional view, along the section line B-B, of the intermediate structure of FIG. 3A;

FIG. 3C is a schematic cross-sectional view, along the section line C-C, of the intermediate structure of FIG. 3A;

FIG. 5A is a schematic plan view of an intermediate structure in a method for fabricating a strained channel field effect transistor, according to an embodiment of the present invention;

FIG. 5B is a schematic cross-sectional view, along the section line B-B, of the intermediate structure of FIG. 5A;

FIG. 5C is a schematic cross-sectional view, along the section line C-C, of the intermediate structure of FIG. 5A;

FIG. 6A is a schematic plan view of an intermediate structure in a method for fabricating a strained channel field effect transistor, according to an embodiment of the present invention;

FIG. 6B is a schematic cross-sectional view, along the section line B-B, of the intermediate structure of FIG. 6A;

FIG. 6C is a schematic cross-sectional view, along the section line C-C, of the intermediate structure of FIG. 6A;

FIG. 7A is a schematic plan view of an intermediate structure in a method for fabricating a strained channel field effect transistor, according to an embodiment of the present invention;

FIG. 7B is a schematic cross-sectional view, along the section line B-B, of the intermediate structure of FIG. 7A;

FIG. 7C is a schematic cross-sectional view, along the section line C-C, of the intermediate structure of FIG. 7A;

DETAILED DESCRIPTION

Figure 2A:
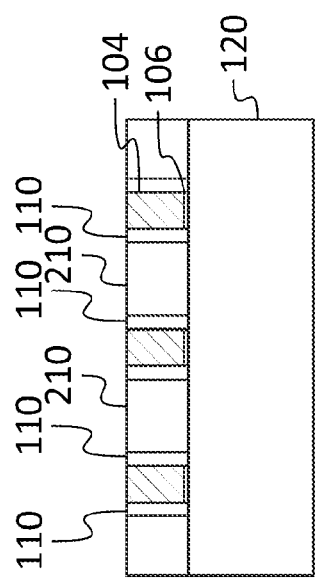
FIG. 2A is a schematic plan view of an intermediate structure in a method for fabricating a strained channel field effect transistor, according to an embodiment of the present invention.

The detailed description set forth below in connection with the appended drawings is intended as a description of exemplary embodiments of a method for straining a fin field effect transistor (finFET) channel provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

In some embodiments, a method to fabricate strained channel fin field effect transistor (finFET) devices is based on the use of a sacrificial epitaxial gate stressor. The fabrication flow includes the steps (acts) of formation of the sacrificial epitaxial gate stressor and corresponding spacers, the formation of deep source drain (SD) recesses or fin cuts in order to elastically relax the structure formed by the fin and sacrificial epitaxial gate, the filling of the SD recess or fin cuts, and the removal of the sacrificial epitaxial gate stressor selectively to the channel material during the replacement metal gate (RMG) module.

In the following, an example of a method according to an embodiment of present invention is presented. One of skill in the art will understand that there are many possible ways to implement a sacrificial epitaxial gate stressor. The flow presented is an exemplary flow, and many modifications are possible at various steps. Particularly, any variations used in related art flows at different steps in the flow may be incorporated when suitable. Not every step in the flow is described, as some steps may be similar to those in related art flows. It will be understood that additional fabrication steps precede the steps described, may be intercalated between the steps described, or may follow the steps described. A flow for fin on bulk is shown as example, but the invention is applicable to fin on insulator structures as well. It will be understood that several parts of the flows may be performed in nMOS and p-type metal oxide semiconductor (pMOS) devices separately, with the other type of device masked.

The flow starts with fin formation as in standard fin flows, with formation of fin structures in which the fin structures are substantially single crystal structures. The steps of dummy silicon oxide (SiO2)/polycrystalline silicon (poly-Si) gate and spacer formation may result in the intermediate structure shown in FIGS. 1A-1C. A dummy gate module is implemented as in related art flows, forming SiO2/poly-Si dummy gates 100 for example, each including a dummy gate cap 102, a dummy gate amorphous or polycrystalline silicon (poly-Si) structure 104, and a dummy gate oxide 106. After dummy gate formation, spacers 110 are formed as in related art flows. For example, nitride spacers 110 may be formed. More advanced spacers 110 (e.g. bi-layer spacers, etc.) may be used as well, as in the related art. In the plan view of FIG. 1A, shallow trench isolation (STI) structures 115 alternate with fins 120 between structures consisting of dummy gates 100 and spacers 110. The drawings of FIGS. 1A-1C are schematic drawings and are not drawn to scale.

Figure 2B:
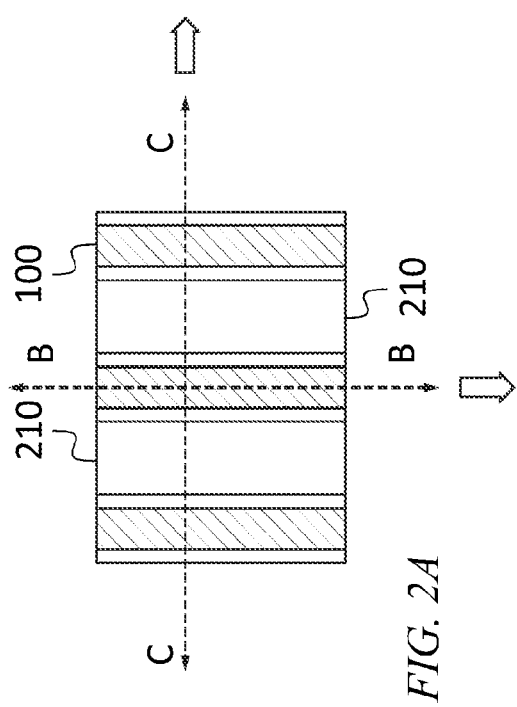
FIG. 2B is a schematic cross-sectional view, along the section line B-B, of the intermediate structure of FIG. 2A.
Figure 2C:
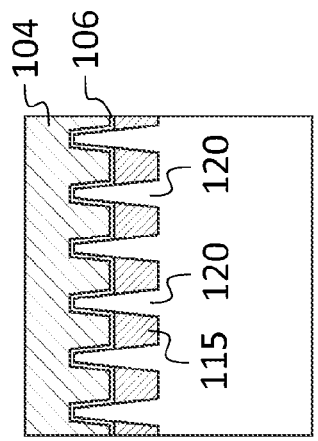
FIG. 2C is a schematic cross-sectional view, along the section line C-C, of the intermediate structure of FIG. 2A.

The steps of insulator deposition and planarization, and of providing access to the poly-Si gate top, may result in the intermediate structure shown in FIGS. 2A-2C, in which FIG. 2C corresponds to a cut along a fin. Instead of proceeding towards the SD module as in some related art flows, an insulating layer 210 may be deposited followed by chemical and mechanical planarization (CMP) steps to planarize and access the top of the dummy gate poly-Si structure 104 (etch steps may be added as appropriate). The insulating layer 210 may be an oxide layer. A thin etch stop layer such as a nitride may be deposited first, followed by the oxide fill. This is similar to the steps following SD regrowth and preceding the replacement metal gate (RMG) module in related art flows (and different approaches employed in related art flows can be applied).

The subsequent steps of removing the dummy gate oxide (e.g., silicon oxide (e.g., SiO2)) 106 and the dummy gate poly-Si structure 104 may result in the intermediate structure shown in FIGS. 3A-3C. The removal of the dummy gate poly-Si structure 104 and dummy gate oxide 106 may be performed using techniques similar to those used at the RMG module in related art flows. The space that had been occupied by the dummy gate (i.e., by the dummy gate poly-Si structure 104 and dummy gate oxide 106) before its removal may be referred to herein as the "gate cavity".

Figure 4A:
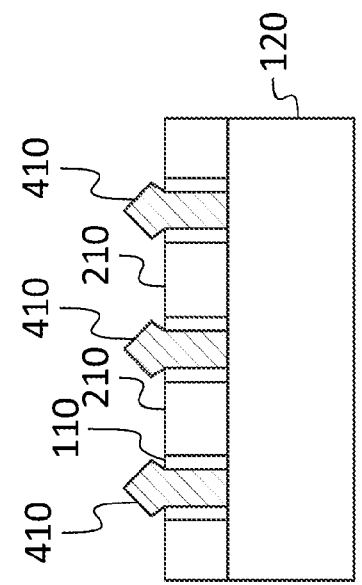
FIG. 4A is a schematic plan view of an intermediate structure in a method for fabricating a strained channel field effect transistor, according to an embodiment of the present invention.
Figure 4B:
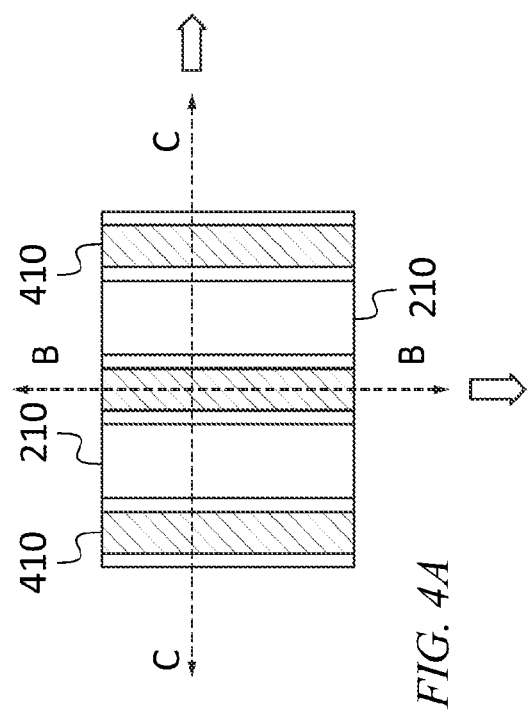
FIG. 4B is a schematic cross-sectional view, along the section line B-B, of the intermediate structure of FIG. 4A.
Figure 4C:
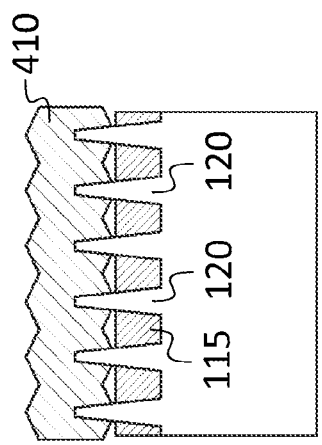
FIG. 4C is a schematic cross-sectional view, along the section line C-C, of the intermediate structure of FIG. 4A.

The intermediate structure shown in FIGS. 4A-4C may be the result of subsequent steps preceding and including one or more steps to grow sacrificial epitaxial gate stressors 410. Surface preparation steps may be performed to condition the fin surface within the gate cavity for epitaxial growth. A selective epitaxial growth process may then be performed to grow an epitaxial sacrificial gate directly (and epitaxially) on the fin surface. The sacrificial epitaxial gate stressors 410 may be composed of a single layer of uniform composition, or it may be a stack of several layers of different compositions, or have a composition gradient, or it may include combinations of the above. The sacrificial epitaxial gate stressors 410 may also have layers of different epitaxial materials. Also, it may be composed of an epitaxial layer on bottom (grown epitaxially on the fin surface) and a non-epitaxial layer on top; both these layers may be composed of sub-layers as well (of different compositions or materials). Any of the layers may have compositional gradients.

For each sacrificial epitaxial gate stressor 410 to function as a sacrificial stressor, the lattice parameter of the epitaxial sacrificial gate stressor material (in its relaxed state) may be chosen to be larger than the lattice parameter of the fin material (in its relaxed state) when tensile strain is desired in the channel of the finished devices; this may be the case for Si channel nMOS devices. In some embodiments, a silicon germanium (SiGe) sacrificial epitaxial gate stressor 410 can be used for this purpose, with a Ge content greater than that of the fin (which may also include some germanium) by between 10% and 50%, or in some embodiments by between 20% and 30%. The Ge content may vary within the sacrificial epitaxial gate stressor 410, e.g., within the range from 10% to 100%. Care may be taken that the SiGe sacrificial epitaxial gate stressor 410 grows without substantial relaxation. Substantial relaxation of the SiGe sacrificial epitaxial gate stressor 410 during growth may have two detrimental effects: first, it may reduce or eliminate the ability of this layer to act as a stressor to impart strain to the channel in later steps of the flow; second, plastic relaxation that may occur during growth may introduce extended defects (such as dislocations) that may be detrimental to the devices. In particular, it may be advantageous that few or no extended defects be introduced during the early stages of sacrificial epitaxial gate growth (which may be close to the fin surface). For these reasons, care may be taken to avoid exceeding the metastable critical thickness for the sacrificial epitaxial gate stressor 410 (considering subsequent process steps performed while the sacrificial epitaxial gate stressor 410 is still in place). Another consideration for selection of the epitaxial sacrificial gate material is that it may be advantageous for this material to be etched selectively to the fin material without significant fin loss. As described in the related art, it is possible to etch silicon germanium (SiGe) (e.g. with Ge in 20%-35% range) selectively to Si with significant selectivity in wet etches. For example, for a Si channel device (Si fin), the gate epitaxial stressor may be a layer of SiGe with Ge content in about the 20%-30% range.

Similar considerations may be made for the case in which the desired strain in the channel of finished devices is compressive, for example, for applications in Si channel, SiGe channel or Ge channel pMOS devices. In this case, the lattice parameter of the epitaxial sacrificial gate stressor material (in its relaxed state) may be chosen to be smaller than the lattice parameter of the fin material (in its relaxed state), inducing compressive strain in the channel of the finished devices. For example, for SiGe channel or Ge channel pMOS devices (i.e. fin material being SiGe or Ge), the sacrificial epitaxial gate stressor can be a SiGe alloy of lower Ge content than the fin material. Typically, a delta (or difference) in Ge content between fin and sacrificial epitaxial gate stressor would be about 20%-30% Ge, or, in some embodiments, between 10% and 50%. For example, if the fin material is SiGe with Ge content of 20%-30% Ge, the sacrificial epitaxial gate stressor may be Si. As described in the related art, it is possible to etch Si selectively to SiGe with Ge in the 20%-30% range, with significant selectivity, in wet etches.

Another consideration to be taken into account is that the bottom of the gate cavity in which the sacrificial epitaxial gate stressor is grown may have topography and at least two different types of material surfaces: both fins and isolation (typically oxide) in between fins may be present at the bottom of the gate cavity. Since the epitaxial growth may be selective (e.g., either it grows only on the single crystal semiconductor surfaces or it is removed from the insulator surfaces during the process), the sacrificial epitaxial gate structure grows from the fins within the gate cavity (similarly to epitaxially formed SD structures used in the related art). The growth process may be continued until the epitaxial layers grown on adjacent fins merge, achieving a "merged" structure. Growth may continue until the gate cavity is filled (although, for facetted growth, there may be voids left under the merged regions).

In FIGS. 4A-4C, the shapes are representations and may not accurately portray the shapes obtained in real growth—other shapes are possible. The schematic of FIG. 4C is a cross section along a fin.

The subsequent step of planarization, after the sacrificial epitaxial gate stressor growth, may result in the intermediate structure shown in FIGS. 5A-5C. This planarization step may use CMP for example.

The intermediate structure shown in FIGS. 6A-6C may be the result of subsequent steps preceding and including the formation of an insulating cap 610 over the sacrificial epitaxial gate stressors 410. In these steps the sacrificial epitaxial gate stressors 410 may be selectively etched, and an insulating capping layer may be formed over each sacrificial epitaxial gate stressor 410, so that it is fully enclosed. There are several ways in which this may be accomplished. In one exemplary embodiment, the top of the sacrificial epitaxial gate is recessed (e.g., using a selective etch), followed by the deposition of an insulating layer to form the insulating cap 610, followed by a planarization (e.g., CMP) step. A nitride may be used as the insulating cap 610.

The intermediate structure shown in FIGS. 7A-7C may be the result of subsequent steps including the removal of insulating layer 210 in between gate structures to expose SD areas. The insulating layer (e.g., oxide), which was formed between the gate structures in the steps resulting in the intermediate structure shown in FIGS. 2A-2C, may be removed selectively so that the gate structures with capping layers (e.g., the sacrificial epitaxial gate stressors 410 and the insulating caps 610) are maintained in place. If an etch stop layer (e.g. a thin nitride) was implemented in the steps resulting in the intermediate structure shown in FIGS. 2A-2C, this layer may be etched as well, to expose the SD regions. After this step is completed, the SD regions are exposed, and the insulating caps 610 remain over the sacrificial epitaxial gate stressors 410.

Figure 8:
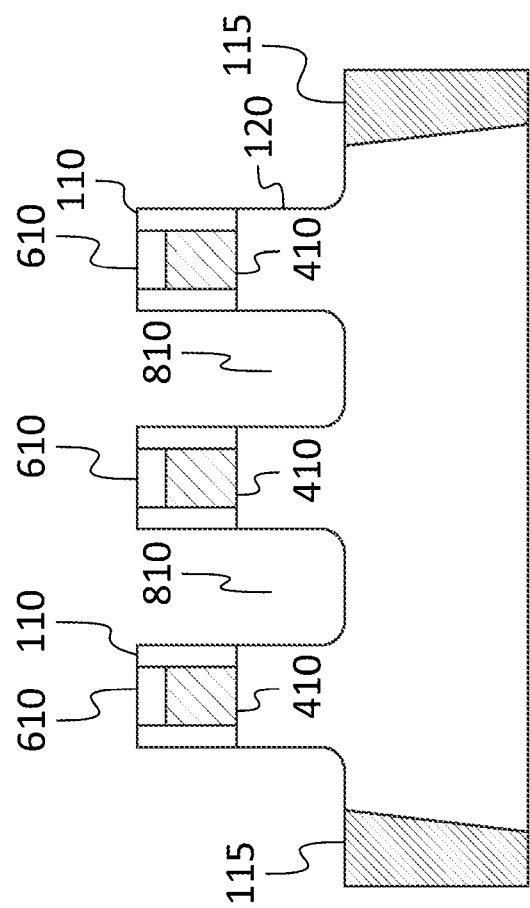
FIG. 8 is a schematic cross-sectional view of an intermediate structure in a method for fabricating a strained channel field effect transistor, according to an embodiment of the present invention.

FIG. 8 shows an intermediate structure that may result from the formation of deep SD recesses 810. Deep SD recesses 810 may be formed by etching the fin material (as in related art steps to form deep SD recesses). The SD recess may extend nearly to the bottom of the fin (i.e. to a height close to the surface plane of the shallow trench isolation (STI) structures 115). Deep SD recesses allow the fin and sacrificial epitaxial gate structures in between the SD recesses to relax elastically, resulting in a strain in the channel induced by the sacrificial gate stressor. As explained above, for sacrificial epitaxial gate stressors made of materials with a larger lattice parameter (when in relaxed state) than that of the fin material (when in relaxed state), the resulting strain induced by the sacrificial epitaxial gate stressor on the fin is tensile, while for sacrificial epitaxial gate stressors made of materials with smaller lattice parameter (when in relaxed state) than that of the fin material (when in relaxed state), the resulting strain induced by the sacrificial epitaxial gate stressor on the fin is compressive. To achieve significant transfer of strain into the channel layer, it may be advantageous that the distance between adjacent SDs be about 200 nm or less, e.g., 50 nm or less (to provide effective elastic relaxation).

Figure 9:
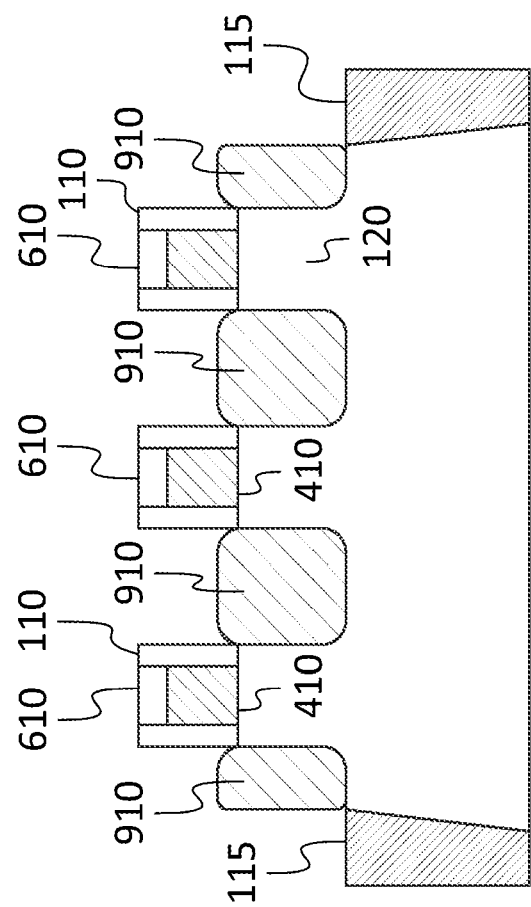
FIG. 9 is a schematic cross-sectional view of an intermediate structure in a method for fabricating a strained channel field effect transistor, according to an embodiment of the present invention.

FIG. 9 shows an intermediate structure that may result after subsequently performed SD regrowth. A relaxed SD 910 may be epitaxially regrown (allowing defect formation in the epitaxially regrown SD material) so that strain in the channel is preserved. This may be readily achieved by one of skill in the art; indeed achieving a SD regrowth that would change the stress state of the channel as from the state before SD regrowth may be more challenging than re-growing the SDs 910 in a way that does not change the strain in the channel from the state before SD regrowth. In some embodiments, the SD 910 is filled or regrown with non-epitaxial material, also without changing the strain state in the channel significantly. The refilled and/or regrown SDs 910 may then act as pinning structures to anchor the ends of the fin and hold the strain in the channel at the sacrificial epitaxial gate removal step.

In some cases, a SD regrowth which grows coherently with the fin crystal, so that it may change the strain state of the channel during growth, may be advantageous. An example is for pMOS fins; a mid- or high-Ge SiGe SD 910 may add additional compressive strain to the channel. These implementations are not precluded from the scope of the present invention, and may be used to further boost strain in the channel.

The growth of SD stressors (i.e., SDs 910 that impart additional strain to the channel, and during the growth of which the strain state in the channel changes) may be significantly more challenging to implement in structures like horizontal nano-sheets (hNS) or horizontal nanowires (hNW), since in these cases, the SD may be nucleating and growing from multiple surfaces (bottom, end of each nano-sheet or nano-wire) which in most cases will not have the registry of a single crystal (i.e., there is no single crystal that matches coherently all these surfaces). When the different grow-fronts (most of which may be unstrained as they meet) meet, defects may be formed (e.g., low angle grain boundaries, stacking faults, etc.). The relative ease of using the methods described herein for fin structures (as compared with hNS and hNW structures) may make fin structures more attractive than hNS or hNW in some suitable applications.

In some fin flows using some initially strained fin material (e.g., fin on a strain-relaxed buffer (SRB) layer) it may be difficult to recover the strain loss resulting from the deep SD recess (or fin cut) by re-growing the epitaxially grown SD 910. While this may be a problem for fin flows that rely on underlayer stressors like SRB, in embodiments of the present invention it may be an advantage.

In some embodiments, the SD 910 is grown or deposited in a way that does not change substantially the strain state in the channel (compared to the strain state before SD growth or deposition). In some embodiments, an epitaxial material may be used that has a different lattice parameter than the material removed in the deep SD recess, so that an additional strain (of the same type as that present in the channel immediately after performing the deep SD recess) may be obtained. In some embodiments the SD regrowth is done by growth of an epitaxial layer. In some embodiments, this epitaxial layer may have defects. In some embodiments, the SD refill is deposited in this step and does not grow epitaxially. In some embodiments, the SD regrowth or refill results in a SD 910 that is substantially of the same height or taller than the material removed at the SD recess step, i.e., in the top of the SD 910 after this step may be about level with, or taller than, the fin top surface at the channel.

Figure 10:
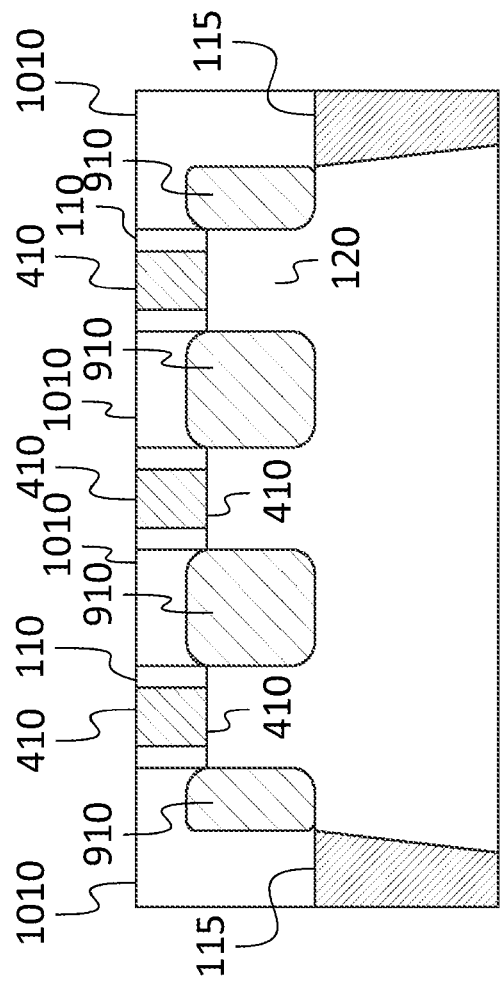
FIG. 10 is a schematic cross-sectional view of an intermediate structure in a method for fabricating a strained channel field effect transistor, according to an embodiment of the present invention.

FIG. 10 shows an intermediate structure that may result after the subsequently performed steps of forming an inter-level dielectric (ILD) layer 1010, and CMP to provide access to top of the sacrificial epitaxial gate stressors 410. The flow may proceed similarly to that of related art flows until the RMG module. For example, the steps of the flow may include the steps of insulator deposition such as ILD (e.g., an oxide) deposition (with possibly a thin etch stop layer deposited before the oxide), followed by planarization (CMP) (as well as any etch steps if appropriate), after which the top regions of the sacrificial epitaxial gate stressors 410 may be exposed and accessible from the top.

Figure 11:
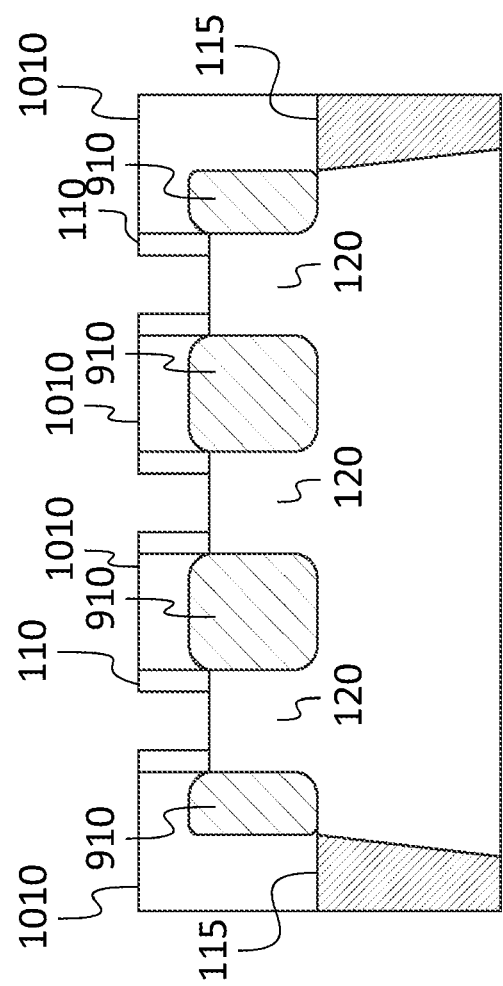
FIG. 11 is a schematic cross-sectional view of an intermediate structure in a method for fabricating a strained channel field effect transistor, according to an embodiment of the present invention.

FIG. 11 shows an intermediate structure that may result after the subsequently performed step of selective sacrificial epitaxial gate stressor removal. The sacrificial epitaxial gate stressor 410 is removed selectively (i.e., without substantial etch of the fin material or ILD). This may be accomplished in a selective wet etch. For the combinations described above (for example as described for the steps resulting in the intermediate structure of FIGS. 4A-4C), e.g., Si fin and SiGe sacrificial epitaxial gate stressors 410 for nMOS or SiGe fin and Si sacrificial epitaxial gate stressors 410 for pMOS, etc.), selective wet etches are available as is known in the art.

Some of the channel strain may be lost during the selective sacrificial epitaxial gate removal, due to elastic relaxation of the whole structure (including the SD 910 and the channel, or fin 120). However, a significant portion of the strain may remain after selective sacrificial epitaxial gate stressor removal, due to the SDs 910 holding the structures substantially in place. In some embodiments strain loss in the channel during sacrificial layer etch may be of about 10% or less. In some embodiments strain loss in the channel during sacrificial layer etch may be of about 20% or less. In some embodiments strain loss in the channel during sacrificial layer etch may be of about 50% or less.

Subsequently performed replacement metal gate (RMG) formation (which may include the steps of interface layer (IL) formation, high-k (HK) formation, and metal gate formation), and the remainder of the fabrication steps, may follow as in related art fin flows.

Flows employed with embodiments of the present invention may be on bulk or on OI substrates (e.g. SOI, GeOI, or in general XOI). In one alternative embodiment, the step of formation of an insulating cap 610 over the sacrificial epitaxial gate stressors 410 (which may result in the intermediate structure shown in FIGS. 6A-6C) is omitted, and the process proceeds directly from the steps resulting in the intermediate structure shown in FIGS. 5A-5C to the steps (including the removal of insulating layer 210 in between gate structures to expose SD areas) resulting in the intermediate structure shown in FIGS. 7A-7C. An oxidation step may then be used to oxidize a top layer of the sacrificial epitaxial gate stressor 410, i.e., to form an insulating layer (e.g., an oxide layer) on the top of the sacrificial epitaxial gate stressor 410. After this, the flow continues, including the steps of forming of deep SD recesses 810 (resulting, for example, in the intermediate structure shown in FIG. 8) and subsequent steps.

Embodiments of the present invention may be complimentary to methods for generating fin strain by SD epitaxial stressors, and in principle SD stressors may be added to the flows of embodiments of the present invention as additional stressors. In any case, with scaling, the volume of SD material may be reduced and the amount of strain possible from SD stressors may be reduced. Also, SD stressors may be challenging to implement to achieve tensile strained channels in nMOS devices. Embodiments of the present invention may facilitate the generation of tensile channel strain for nMOS devices.

In fin processes in which the final fin has layers of different materials, (e.g. a Si core and strained SiGe on top for pMOS), the stressor layers may remain in the final fin structure (i.e., they may not be removed during processing). When the final fin structure contains several layers, the fin width may be larger in order to accommodate the different layers at reasonable thicknesses. This may make electrostatic control more difficult and may also make it more difficult to fabricate devices with tight fin pitches. By contrast, in embodiments of the present invention, the stressor layer may be removed and so the final fin may be relatively thin (e.g. about 5-8 nm), facilitating electrostatic control.

The use of sacrificial epitaxial stressor layers grown around the whole fin structure before the dummy gate module may involve the use of internals spacers to avoid large parasitic capacitance, and processing may be challenging if the gap between fins is to be filled quite fully with the sacrificial stressor layer or later in the flow with internal spacer material, to prevent large parasitic capacitance. By contrast, in embodiments of the present invention, which may avoid the need and use of internal spacers to lower parasitic capacitance, these issues may be avoided.

In light of the foregoing, channel strain may be created in a finFET by depositing a sacrificial epitaxial gate stressor on the fin, causing strain in the fin, forming SD structures to anchor the ends of the fin, and then removing the sacrificial epitaxial gate stressor.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art. As used herein, the term "major component" means a component constituting at least half, by weight, of a composition, and the term "major portion", when applied to a plurality of items, means at least half of the items.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration. As used herein, the terms "use," "using," "used," and "step" may be considered synonymous with the terms "utilize," "utilizing," and "utilized," and "act," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of a method for straining a finFET channel have been specifically described and illustrated herein, many modifications and variations will be apparent to those skilled in the art. Accordingly, it is to be understood that a method for straining a finFET channel according to principles of this invention may be embodied other than as specifically described herein. The invention is also defined in the following claims, and equivalents thereof.

What is claimed is:

1. A method for fabricating a strained channel for a fin field effect transistor (finFET) device having a fin comprising the channel, the fin being substantially a single crystal of a material having in its relaxed state a first lattice constant, the method comprising:
   forming, on the channel of the fin, a stressing structure to induce strain on the channel, the stressing structure being substantially a single crystal of a material having in its relaxed state a second lattice constant different from the first lattice constant;
   forming a first source drain recess at a first end of the fin;
   forming a second source drain recess at a second end of the fin;
   forming a first source drain within the first source drain recess;
   forming a second source drain within the second source drain recess; and
   removing the stressing structure.

2. The method of claim 1, wherein the forming of the stressing structure comprises growing the stressing structure epitaxially.

3. The method of claim 1, wherein:
   the finFET device is an n-type metal oxide semiconductor device, and
   the second lattice constant is greater than the first lattice constant by at least 10%.

4. The method of claim 1, wherein:
   the finFET device is an n-type metal oxide semiconductor device,
   the fin is substantially composed of silicon or silicon germanium, and the stressing structure is substantially composed of silicon germanium with an average germanium content higher than a germanium content of the fin by between 10% and 50%.

5. The method of claim 4, wherein the average germanium content of the stressing structure is higher than the germanium content of the fin by between 20% and 30%.

6. The method of claim 4, wherein a germanium content of the stressing structure varies within the stressing structure from a minimum germanium content to a maximum germanium content, each of the minimum germanium content and the maximum germanium content being greater than 10% and less than or equal to 100%, the difference between the maximum germanium content and minimum germanium content being at least 10%.

7. The method of claim 1, wherein:
the finFET device is a p-type metal oxide semiconductor device, and
the first source drain and/or the second source drain is composed of:
silicon, or
silicon germanium including at least 30% germanium.

8. The method of claim 1, wherein:
the finFET device is a p-type metal oxide semiconductor device, and
the second lattice constant is less than the first lattice constant by at least 10%.

9. The method of claim 1, wherein:
the finFET device is a p-type metal oxide semiconductor device,
the fin is substantially composed of silicon germanium, and
the stressing structure is substantially composed of silicon germanium with an average germanium content lower than a germanium content of the fin by between 10% and 50%.

10. The method of claim 9, wherein the average germanium content of the stressing structure is lower than the germanium content of the fin by between 20% and 30%.

11. The method of claim 9, wherein a germanium content of the stressing structure varies within the stressing structure from a minimum germanium content to a maximum germanium content, each of the minimum germanium content and the maximum germanium content being greater than 10% and less than or equal to 100%, the difference between the maximum germanium content and minimum germanium content being at least 10%.

12. The method of claim 1, wherein:
the forming of the first source drain comprises growing the first source drain as an epitaxial layer; and
the forming of the second source drain comprises growing the second source drain as an epitaxial layer,
a strain state in the channel after the forming of the first source drain and the forming of the second source drain having a strain greater, by at least 10%, than a strain of the strain state in the channel before the forming of the first source drain and the forming of the second source drain.

13. The method of claim 1, wherein:
the forming of the first source drain comprises growing the first source drain as an epitaxial layer; and
the forming of the second source drain comprises growing the second source drain as an epitaxial layer,
a strain state in the channel after the forming of the first source drain and the forming of the second source drain having a strain differing from a strain of the strain state in the channel before the forming of the first source drain and the forming of the second source drain by no more than 30%.

14. The method of claim 13, wherein the strain of the strain state in the channel after the forming of the first source drain and the forming of the second source drain differs from the strain of the strain state in the channel before the forming of the first source drain and the forming of the second source drain by no more than 10%.

15. The method of claim 1, wherein:
the forming of the first source drain comprises growing the first source drain as a non-epitaxial layer; and
the forming of the second source drain comprises growing the second source drain as a non-epitaxial layer,
a strain state in the channel after the forming of the first source drain and the forming of the second source drain having a strain differing from a strain of the strain state in the channel before the forming of the first source drain and the forming of the second source drain by no more than 30%.

16. The method of claim 15, wherein the strain of the strain state in the channel after the forming of the first source drain and the forming of the second source drain differs from the strain of the strain state in the channel before the forming of the first source drain and the forming of the second source drain by no more than 10%.

17. The method of claim 1, wherein:
the forming of the first source drain recess comprises forming the first source drain recess to a depth of at least about 10 nm; and
the forming of the second source drain recess comprises forming the second source drain recess to a depth of at least about 10 nm.

18. The method of claim 1, wherein the finFET device is formed on a substrate, and wherein the stressing structure is formed on a vertical surface of the fin and on a horizontal surface of the fin.

19. A method for fabricating a strained channel for a fin field effect transistor (finFET) device having a fin comprising the channel, the fin being substantially a single crystal of a material having in its relaxed state a first lattice constant, the method comprising:
forming, on the fin, a stressing structure, the stressing structure being substantially a single crystal of a material having in its relaxed state a second lattice constant different from the first lattice constant;
forming a first source drain recess at a first end of the fin;
forming a second source drain recess at a second end of the fin;
forming a first source drain within the first source drain recess;
forming a second source drain within the second source drain recess; and
etching the stressing structure with an etch having an etch selectivity of at least 40:1 for etching the stressing structure selectively to the fin.

20. A method for straining a fin of a fin field effect transistor (finFET) device, the fin being substantially a single crystal of a material having in its relaxed state a first lattice constant, the method comprising:
forming, on a channel of the fin, a stressing structure to induce strain on the channel, the stressing structure being substantially a single crystal of a material having in its relaxed state a second lattice constant different from the first lattice constant;
forming a first source drain recess at a first end of the fin;

forming a second source drain recess at a second end of the fin;
forming a first source drain at a first end of the fin;
forming a second source drain at a second end of the fin;
forming an interlevel dielectric (ILD) layer over the first source drain and the second source drain; and
removing the stressing structure.

* * * * *